(12) United States Patent
Wen-Chen

(10) Patent No.: US 6,269,003 B1
(45) Date of Patent: Jul. 31, 2001

(54) HEAT DISSIPATER STRUCTURE

(76) Inventor: Wei Wen-Chen, P.O. Box No. 6-57, Chung-Ho City, Taipei Hsien 235 (TW)

(*) Notice: Subject to any disclaimer, the term of this patent is extended or adjusted under 35 U.S.C. 154(b) by 0 days.

(21) Appl. No.: 09/472,213

(22) Filed: Dec. 27, 1999

(51) Int. Cl.[7] ...................................... H05K 7/20
(52) U.S. Cl. .................. 361/704; 165/80.3; 174/16.3; 257/722; 361/697; 361/704
(58) Field of Search .................. 165/80.3, 121, 165/122, 125; 174/16.3; 257/706–707, 714, 712–713, 722; 361/694, 695, 697, 704, 710

(56) References Cited

U.S. PATENT DOCUMENTS

| | | | |
|---|---|---|---|
| 5,558,155 | * | 9/1996 | Ito ........................................ 165/80.3 |
| 6,062,301 | * | 5/2000 | Lu ........................................ 361/697 |
| 6,104,609 | * | 8/2000 | Chen .................................... 361/695 |

FOREIGN PATENT DOCUMENTS

402211700 * 8/1990 (JP) ....................................... 361/694

* cited by examiner

Primary Examiner—Gregory Thompson
(74) Attorney, Agent, or Firm—Dougherty & Troxell

(57) ABSTRACT

An improved structure heat dissipater for computer central processing units (CPU) having heat sink grid elements perforated with through-holes. The structure of the present invention is comprised of a ventilated hood, heat sink grid elements, and a base plate. The ventilated hood has a plurality of vent holes formed in its top and two lateral surfaces that are aligned with the through-holes in the heat sink grid elements which are interlocked together into a stacked heat sink grid element assembly, thereby forming a honeycomb-like convectionary heat dissipating network of openings. As a result, when air is induced by a fan, air flows through efficiently and rapidly such that heat transfer and diffusion is accelerated from the upper, front, rear, left, and right surfaces, which enhances the overall rate of heat dissipation, effectively improves the removal of heat generated by the CPU, and increases fan performance. As such, the present invention maintains optimal CPU operating temperature and thereby increases computer application stability.

3 Claims, 4 Drawing Sheets

HEAT DISSIPATER STRUCTURE

BACKGROUND OF THE INVENTION

1) FIELD OF THE INVENTION

The invention herein relates to an improved heat dissipater comprised of a ventilated hood and stacked assembly-type heat sink grid elements perforated with through-holes capable of efficient air flow and accelerated heat transfer that provides advantageous low temperature central processing unit (CPU) heat dissipation performance.

2) DESCRIPTION OF THE PRIOR ART

The central processing unit (CPU) is the core component of a computer. Due to computer technology requirements and growth as well developments in integrated circuit technology, CPU execution speed and performance are constantly on the increase. Faster CPU speed results in the generation of greater amounts of heat and if CPU heat dissipation rates are not accelerated, computer operating stability is adversely affected. Therefore, to solve CPU overheating problems, the most direct and simple approach is the installation of a heat dissipation fixture or device onto the CPU and thereby maintain CPU execution stability. At present, most conventional heat dissipation devices consist of a fan and heat sink assembly, wherein the fan is screw fastened onto the heat sink, with the base plate of the heat sink mounted firmly against the CPU such that the high temperature generated by the operating CPU travels through the elements of the heat sink and, due to the air induced by the fan, becomes diffused and discharged to achieve heat dissipation performance. However, a conventional heat sink structure (as shown in FIG. 1) is typically comprised of a one-piece fabricated extruded aluminum heat sink elements 11 and heat sink element base plate 12, and a heat sink cover 10 having a air intake opening 101 formed in the top surface; due to limitations of molding and extrusion technology, the air resistance plane 111 of the heat sink elements 11 are of comparatively larger thickness, which not only results in greater obstruction to the fan-induced air flow, but also retards the rate of heat conductance and, furthermore, the heat dissipation trough 121 is wider, which reduces the number of heat dissipation elements and results in a smaller heat dissipation area; additionally, the heat sink cover 10 enshrouds the heat sink elements 11 such that heat can only emanate from the two ends at the front and rear, which negatively influences the heat dissipation rate of the heat sink and lessens fan performance.

Furthermore, another kind of prior art variation on the market is a staggered fin heat dissipater structure in which, as illustrated in FIG. 2, the heat sink elements 14 are milled, the heat sink elements 14 are fastened or adhered to the base plate 15, and then the cover 13 is assembled over the heat sink. However, during fabrication, a separation area 141 is required in between each of the heat sink elements 14, which reduces the heat dissipation surface area and, furthermore, mold production is not simple and quality is difficult to control. With this kind of heat sink element 14, the air flow resistance plane is excessively large and the distances between the flat surfaces and the fan are too close, which results in obstructionary back pressure to the air induced by the fan and compromises fan performance and, furthermore, no improvements to the shortcomings of such extruded aluminum fabricated heat sinks have been introduced.

In view of the various shortcomings in structural design of the conventional heat dissipation devices as well as the resulting utilization and stability drawbacks, the inventor of the invention herein, based on considerable experience in the electronic hardware production and technology, conducted research to find solutions to the said shortcomings which following continuous research and improvement culminated in the successful development of the improved structure heat dissipater of the invention herein, which is capable of collectively eliminating all the shortcomings and drawbacks of the prior art.

The improved structure heat dissipater of the present invention utilizes one-piece punch fabricated heat sink grid elements that are thinner than conventional extruded aluminum and milled heat sink elements and capable of being stacked assembled, with the air flow resistance plane also being of diminished thickness to reduce obstruction to air induced by a fan as well as impedance due to the production of back pressure; furthermore, a higher number of heat sink elements can be positioned in a given area compared to the prior art structures to significantly increase the heat transfer surface contact area and, furthermore, through-holes are formed in each of the heat sink grid elements, with the pattern of through-holes aligned with the vent holes in the two lateral surfaces of the ventilated hood to form a honeycomb-like convection passages, thereby enabling the fan-induced air to flow through efficiently and reducing flow resistance, while causing the heat emanated by the CPU to ascend rapidly and be dissipated and discharged from four surfaces, which not only provides for more optimal heat conductance efficiency, but also enables the heat sink elements to achieve optimal heat dissipation, thereby enhancing fan performance and providing an effective solution to overheating problems resulting from higher CPU operating speeds.

SUMMARY OF THE INVENTION

Therefore, the primary objective of the invention herein is to provide an improved heat dissipater utilizing heat sink grid elements perforated with through-holes and capable of being stacked into a heat sink element assembly; the through-holes are aligned with vent holes in a ventilated hood, thereby forming a honeycomb-like heat conducting network of convection openings such that when air is induced by a fan, the air flow is efficient and rapid and, furthermore, heat transfer from the surfaces is accelerated upward and out through the four surfaces at the front, rear, left, and the right, which enhances the heat dissipation rate and quickens heat dissipation performance. As such, the structure of the present invention conducts away CPU-generated heat and effectively dissipates it to increase computer utilization stability.

To enable a further understanding of the technological means and structural features that allow the most preferred embodiments of the present invention to achieve the objectives, the brief description of the drawings below are followed by the detailed description of the invention.

DETAILED DESCRIPTION OF THE INVENTION

Figure 1:
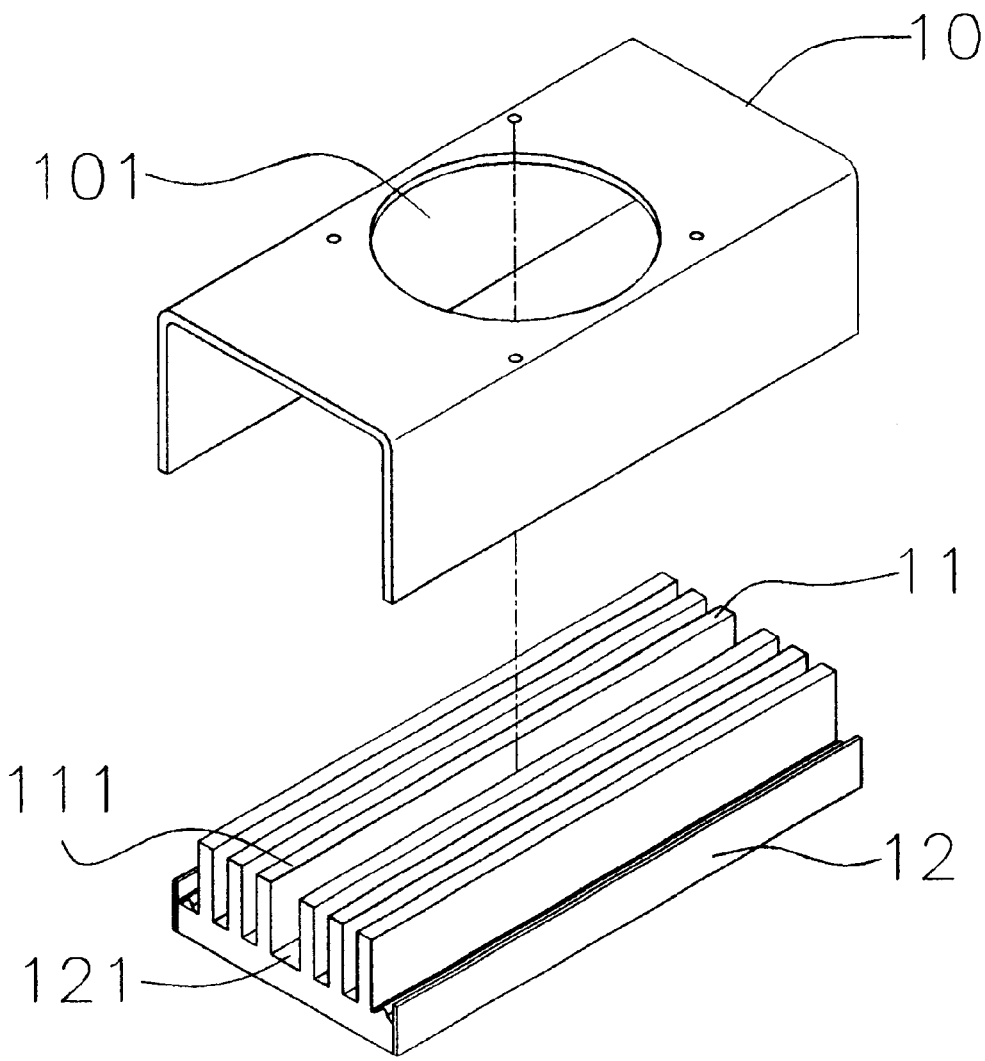
FIG. 1 is an exploded drawing of a conventional heat dissipation device.
Figure 2:
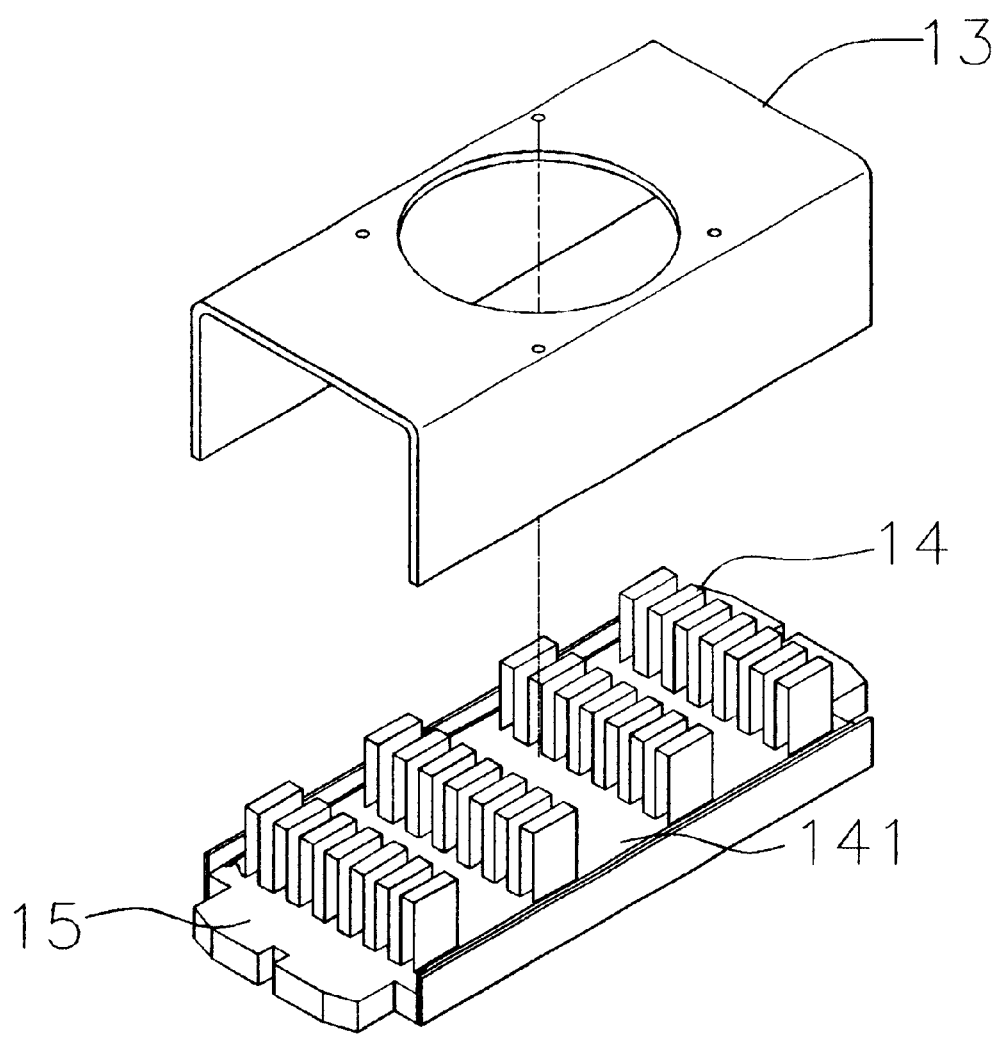
FIG. 2 is an exploded drawing of another conventional heat sink element assembly.
Figure 3:
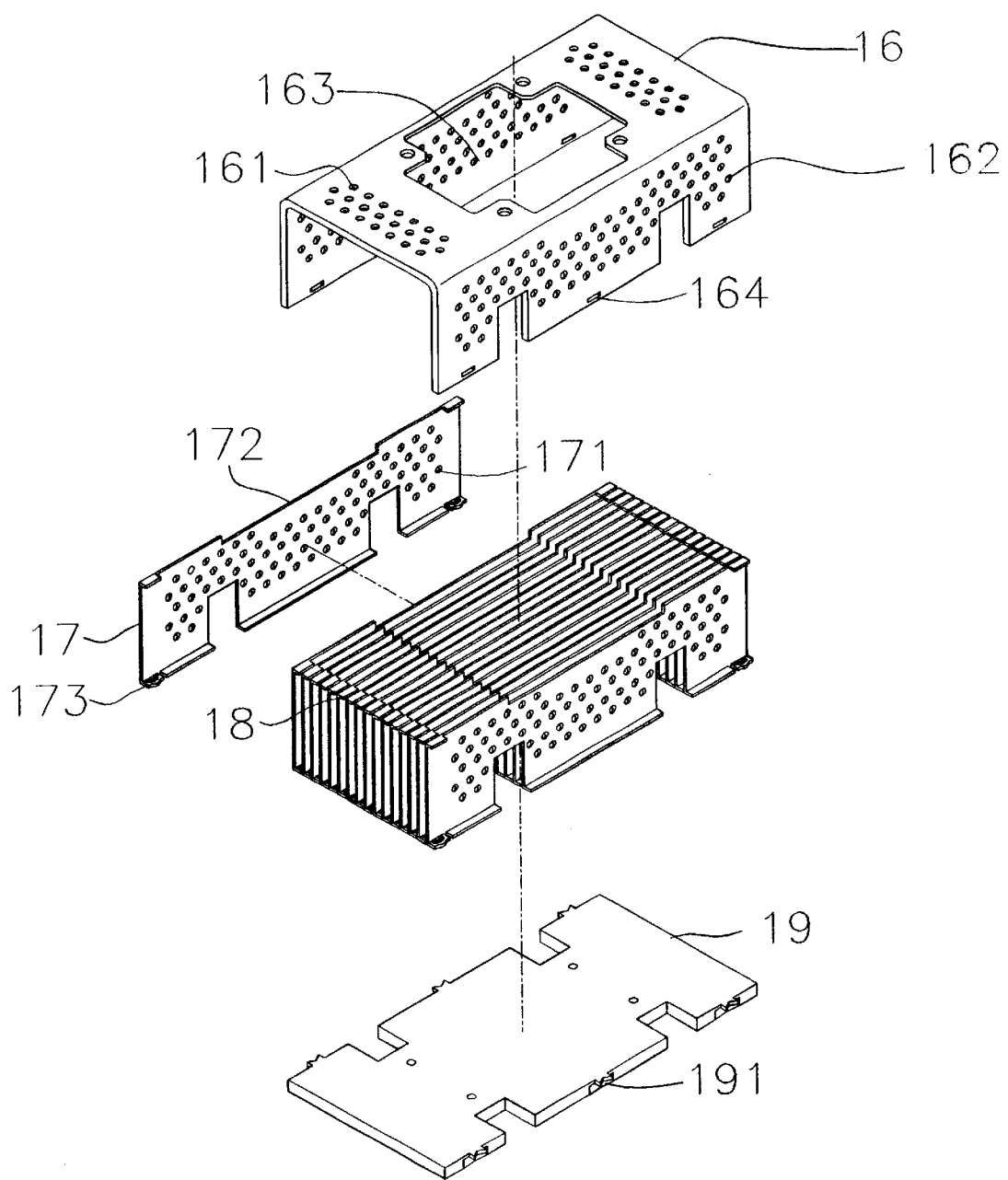
FIG. 3 is an exploded drawing of the invention herein.

Referring to FIG. 3, the assembled unit of the improved structure heat dissipater of the invention herein is comprised of a ventilated hood 16, heat sink grid elements 17, and a base plate 19, wherein the ventilated hood 16 an inverted U-shaped having an air intake opening 163 disposed in the upper surface and a plurality of top vent holes 161 formed along the two adjacent lateral extents and, a plurality of side vent holes 162 are formed in a random but mutually aligned arrangement through the two lateral surfaces to further increase external air contact and confluence. One or more fastening slots 164 are formed on the bottom edges of the lateral surfaces to provide for conjoinment. Heat sink grid elements 17 are of one-piece punch fabricated construction and are structurally thinner than conventional heat sink elements, with an interlocking lip 173 disposed along the bottom edge capable of front-to-back attachment such that when the heat sink grid elements 17 are stacked together to build a heat sink element assembly 18, the total number of heat dissipation elements which can be included the said assembly is more than that of conventional heat sink. As such, there are more complex heat conductance contact regions that yield a larger overall heat dissipation surface area capable of accelerating the diffusion of heat. The heat sink grid element air resistance plane 172 is of minimized thickness to reduce flow-obstructive air turbulence during fan induction though the air intake 163. A plurality of though-holes 171 are formed in the heat sink grid elements 17, with the through-hole 171 pattern matching the structural arrangement of the side vent holes 162 of the ventilated hood 16, thereby forming a honeycomb-like configuration in which the said holes are conventionally aligned. Base plate 19 is a flat planar component having a top surface that accommodates the adhesion of the bottom sections of the heat sink grid elements 17 and one or more fastening hooks 191 are disposed along the two lateral end surfaces that are inserted into the fastening slots 164 of the ventilated hood 16 to achieve conjoinment. The underside of the base plate 19 is tightly installed onto a central processing unit (CPU) by means of clip component (not shown in the drawings).

Figure 4:
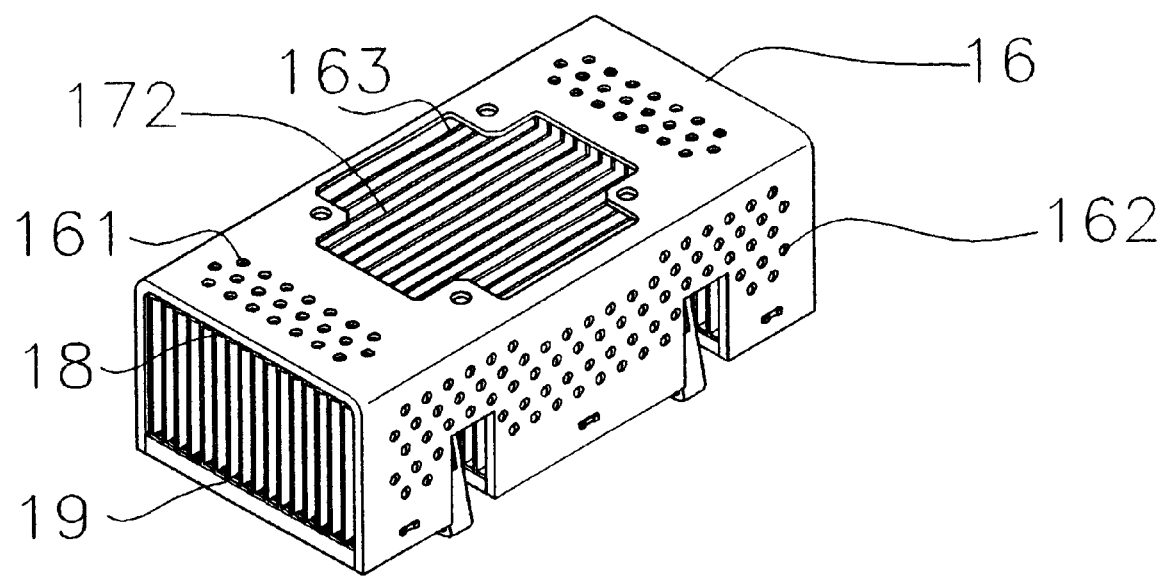
FIG. 4 is an isometric drawing of the invention herein.

Referring to FIG. 4, the heat sink grid elements 17 of the invention herein are stacked together in consecutive order into a heat sink grid element assembly 18 and then adhesively mounted onto the base plate 19 and covered with the ventilated hood 16 such that after conjoinment to the base plate 19, the through-holes 171 of the heat sink grid elements 17 are in convectional alignment with the side vent holes 162 of the ventilated hood 16 in a honeycomb-like arrangement. Therefore, when heat is generated by a CPU, the high temperature current is transferred from the base plate 19 to the heat sink grid elements 17, where it is rapidly absorbed and diffused by the complex heat conductance contact regions and, due to the through-hole 171 design of the heat sink grid elements 17 which naturally form a honeycomb-like perforation pattern, heat diffusion occurs more efficiently. At the same time, as external air is continuously drawn in through the air intake opening 163, the honeycomb-like convection hole arrangement of the heat sink grid elements 17 permits the passage of an accelerated and unimpeded air flow which, in conjunction with the external air contact and confluence enabled by the top vent holes 161 and the side vent holes 162 of the ventilated hood 16, causes the heat to both ascend and become diffused out of four surfaces, thereby providing greater heat dissipation performance.

In summation, since the improved heat dissipater of the invention herein is an innovation of reasonable refinement that not only provides excellent practicality, but is also of an innovative and original design in terms of structural-spatial configuration. The invention, features heat sink grid elements 17 with through-holes 171 constructed utilizing punch fabrication technology that obviously increases computer CPU heat dissipation efficiency, is a superior development that significantly surpasses the prior art technology; and, is progressive in that it effectively improves upon the shortcomings of conventional heat dissipation devices.

What is claimed is:

1. An improved heat dissipater for a central processing unit (CPU) comprising:

a) a base plate configured to be mounted on the CPU;
   b) a ventilated hood mounted to the base plate, the ventilated hood having an upper surface and two opposite lateral surfaces, an air intake opening through the upper surface, a plurality of top vent holes through the upper surface, and a plurality of side vent holes through each of the two opposite lateral surfaces, the side vent holes in lateral surfaces being mutually aligned; and,
   c) a plurality of heat sink grid elements mounted on the base plate and located between the base plate and the upper surface of the ventilated hood and between the two opposite lateral surfaces of the ventilated hood, the heat sink grid elements being located adjacent to and spaced apart from each other, each heat sink grid element having a plurality of through holes in alignment with the plurality of side vent holes.

2. The improved heat dissipater of claim 1 wherein the ventilated hood has an inverted U-shaped cross-sectional configuration.

3. The improved heat dissipater of claim 2 further comprising:

a) at least one fastening slot formed in the side surfaces of the ventilated hood; and,
   b) at least one fastening hook on the base plate located so as to engage the at least one fastening slot so as to attach the base plate to the ventilated hood.

* * * * *